United States Patent [19]

Foster

[11] Patent Number: 5,440,568
[45] Date of Patent: Aug. 8, 1995

[54] SYSTEM FOR DETERMINING THE OPERATIONS OF AN INTEGRATED CIRCUIT AND PROCESSOR FOR USE THEREIN

[75] Inventor: Paul C. Foster, Hampshire, United Kingdom

[73] Assignee: GenRad Inc., Concord, Mass.

[21] Appl. No.: 859,578

[22] Filed: Mar. 27, 1992

[30] Foreign Application Priority Data

Mar. 28, 1991 [GB] United Kingdom ................. 9106758

[51] Int. Cl.6 ............................................. G06F 15/60
[52] U.S. Cl. ................... 395/500; 364/578; 395/183.09
[58] Field of Search ............................. 371/23, 26, 27; 364/578, 488, 489, 490, DIG. 1, 232.2, 280.4

[56] References Cited

U.S. PATENT DOCUMENTS

| | | | |
|---|---|---|---|
| 3,633,100 | 1/1972 | Heilwgil | 371/23 |
| 4,901,259 | 2/1990 | Watkins | 371/23 |
| 5,051,938 | 9/1991 | Hyduke | 371/23 |
| 5,184,308 | 2/1993 | Nagai | 371/23 |
| 5,189,365 | 2/1993 | Ikeda | 324/73.1 |

FOREIGN PATENT DOCUMENTS 0067496 2/1982 European Pat. Off. .

Primary Examiner—Ellis B. Ramirez
Attorney, Agent, or Firm—Lowe, Price, Leblanc & Becker

[57] ABSTRACT

In one aspect, the present invention provides a system for determining the operation of an integrated circuit, comprising:

receiving means (4,5) for receiving and storing information about said integrated circuit and for pre-storing a range of stimuli to be applied to a model of said integrated circuit;

selecting means (6) for selecting at least one stimulus from said range;

a first translator (8) for translating said selected stimulus from a reference language into an alien language;

an alien simulator (12) for applying said translated stimulus to an alien model of said integrated circuit and obtaining a response to said translated stimulus;

a second translator (14) for translating the said response from said alien language to said reference language; and store means (16) for storing said translated response, said stimulus and response portraying operation of the integrated circuit.

The system is thus more efficient and quicker because only one model need be generated and other simulators can be generated from the reference library.

The present invention also relates to a processor (18) for producing a condensed truth table.

10 Claims, 2 Drawing Sheets

SYSTEM FOR DETERMINING THE OPERATIONS OF AN INTEGRATED CIRCUIT AND PROCESSOR FOR USE THEREIN

TECHNICAL FIELD

The present invention relates to a system for determining the operations of an integrated circuit and a processor for use therein and in particular a system and processor for determining the operations of a custom chip.

BACKGROUND OF THE INVENTION

At present there are a number of standard integrated circuits having a plurality of components whose operations and functions are well documented in the manufacturer's manual and other publications. Sometimes, the operations are presented in a truth table which sets out the expected state of the output pins for any given states of the input pins. However, the information given may not always be accurate and complete especially as a manufacturer may not want to publicise all the functions of a chip, some vital information may be omitted by the writer of the manufacturer's manual and if the truth table is digitally encoded then there may not be all the information required to simulate the i.c.

On the other hand, application specific integrated circuits (ASICs) or custom chips often are not accompanied by documented information concerning their operations and functions. The minimum amount of information is usually only given such as the pin names, pin types (i.e. inputs, output etc.), pin ordering and so on. In order to learn from the ASICs or custom chips it is necessary to determine its various operations and functions. A known system for obtaining such functions using a known computer and memories is shown schematically in FIG. 1.

Various tests are made on the ASICs or custom chips by applying voltages or stimuli to the input pins and the changes in the state of the output pins are measured. The results of the tests and the basic information supplied by the manufacturer are then passed to an engineer, known as a modeler, to create a model of the ASICs using his experience. The model is written in a particular computer program language and stored on a compatible system. This model is first tested by the modeler who applies certain stimuli and compares the actual results with the expected results using a simulator. Modifications to the model are made if required. The model and stimulus and results are stored in a library. The operations and functions of the i.c. can be extracted from this stored information. Consequently, the library can be used in the development of the ASIC or by electrical engineers generating circuits using this ASIC.

The testing system may be either a digital simulator, or an analogue simulator. A digital simulator is one that is event driven such that when a stimulus, is applied, the simulator notes that it should schedule an output change after a given period of time T. At T the next stimulus is then applied.

An analogue simulator is not event driven. It applies a stimulus to an input pin and measures the voltage or current at an number of nodes in the ASIC model at equal intervals over a given time period. When testing the model using an analogue simulator it can take up to 10 to 20 hours to apply a particular type of stimulus to the model. If the ASIC is complex, any one of up to 9 types of stimulus may be required. Consequently, an analogue simulator is relatively slow, produces a far greater quantity of results but is more accurate than a digital simulator.

In any case, in order to fully analyse all the functions of the ASIC a large number of stimuli must be applied which generates an enormous set of results. Creating and testing the model in this way, especially using an analogue simulator is extremely labour intensive and time consuming.

The model is written in a particular computer language for use on a particular system. If the model is required on a non-complimentary system, then the modeler must rewrite the model in a suitable computer language. Consequently, ASIC foundaries often produce and support different systems containing the same libraries on the same ASIC. This is extremely time consuming and inefficient.

One further disadvantage known with this system of determining the operations of an ASIC is that the libraries are extremely memory intensive and consequently slow to use and extract information therefrom.

An aim of the present invention is to provide a system and processor for use therein which overcomes these disadvantages.

According to the present invention there is provided a system for determining the operations of an integrated circuit, comprising:

means for receiving and storing information about said i.c. and for storing a range of stimuli to be applied to a model of said i.c.;

means for selecting at least one stimulus;

a first translator for translating said selected stimulus from a reference language into an alien language;

an alien simulator for applying said stimulus to an alien model of said i.c. and obtaining a response to said stimulus;

a second translator for translating said stimulus and responses from said alien language to said reference language; and store means for storing said stimulus and responses, said stimulus and responses representing the operations of the i.c.

The present invention thus provides a system using a known computer in conjunction with another computer housing an existing alien model (i.e. one that has already been generated by a modeler but in another language) and automatically generates a reference library from which other alien simulator libraries can be produced by extracting information from the reference library. The system is thus more efficient and quicker because only one model need be generated and the other simulators can be generated from the reference library.

Also according to the present invention there is provided a processor for condensing a truth table, comprising:

means for receiving said truth table;

means for executing the following three steps in order, or for executing only one of the three steps or for executing the first two steps in order or for executing the last two steps in order, said steps comprising 1) comparing two entries identical in all respects apart from the state of one pin to ascertain whether the state of said pin determines the output of the entries and if the state of said pin is independent of the output then for deleting one of said entries and for repeating the comparison for all input pins 2) identifying two or more entries where the state of the output pin is equal to the state of one of the input pins, the same input pin in each entry, for deleting one or all but one of those entries and amending the remaining entry by inserting the number of the input pin for the state of the output pin and 3) detecting which output state occurs most often, selecting those entries, deleting all but one of those entries and amending the remaining entry by inserting a neutral state for each input pin; and means for outputting the condensed truth table.

This processor enables the results obtained to be condensed to a more manageable form so that the reference library is not memory intensive and the information can be extracted relatively quickly.

BRIEF DESCRIPTION OF THE DRAWINGS

Embodiments of the present invention will now be described with reference to the accompanying drawings, of which.

DETAILED DESCRIPTION

Figure 1:
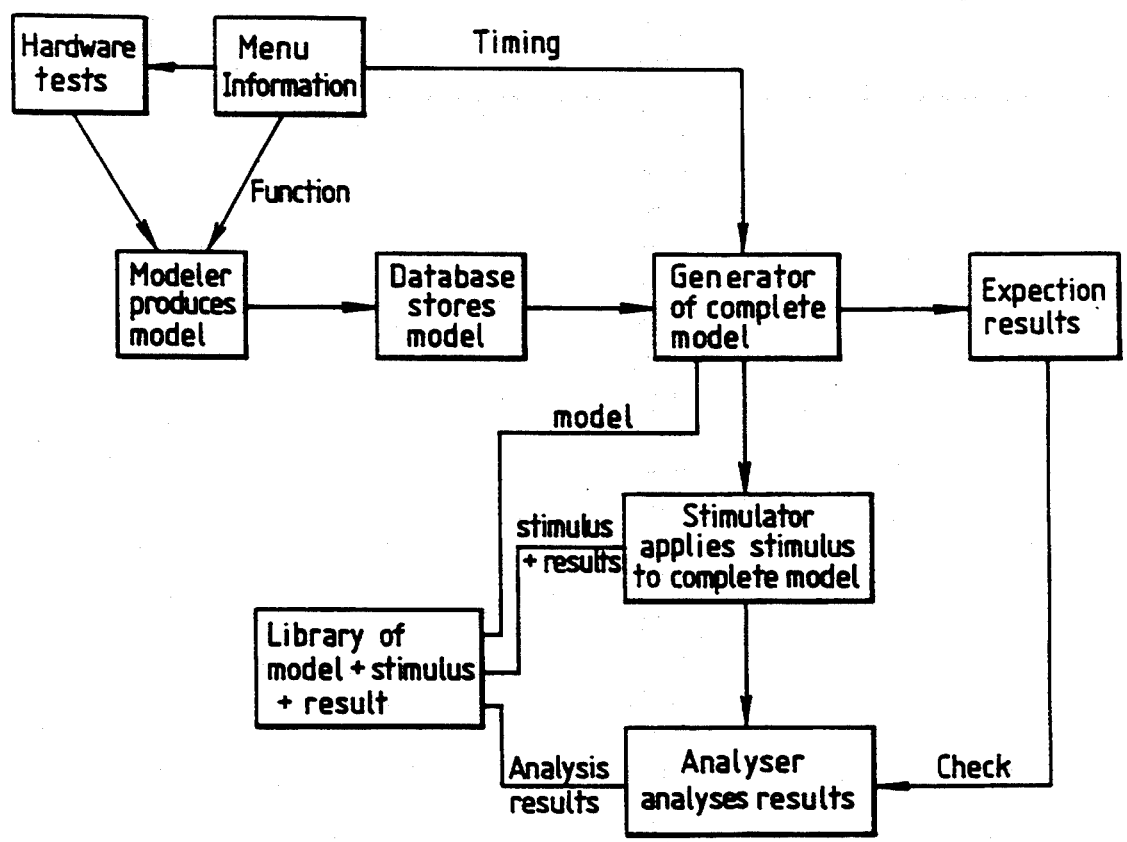
FIG. 1 is a schematic diagram of an existing system for generating a model of an ASIC.
Figure 2:
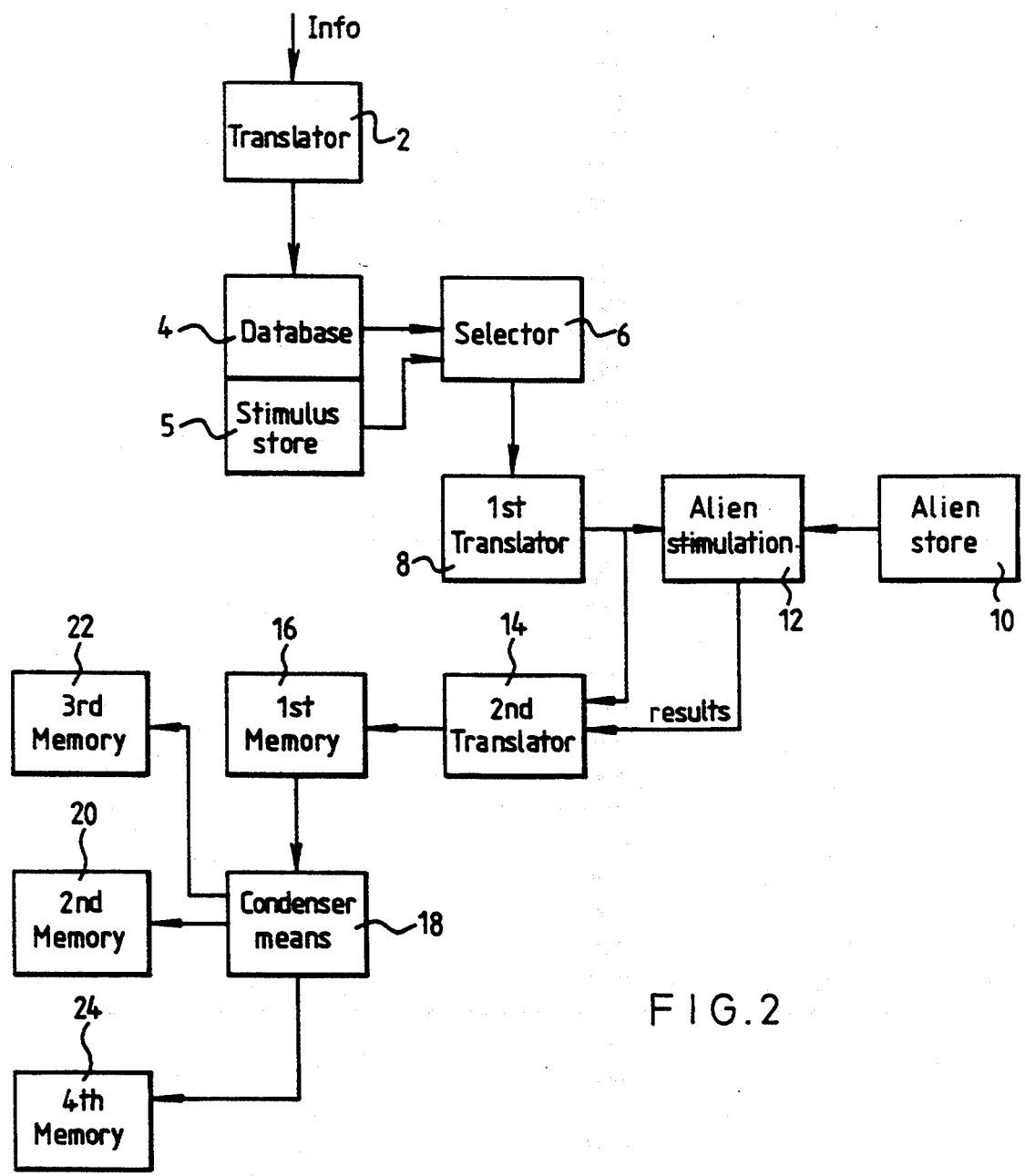
FIG. 2 is a schematic diagram of the system according to a first embodiment of the present invention.

A first embodiment of the present invention is shown in FIG. 2. The system comprises a translator 2 which receives information supplied by the manufacturer concerning information such as the pin names, pin types, pin ordering and so on including pulse rejection, violations, timing and capacitance information if available and translates the information into a reference language of the system. At present, there are four types of pins which may be entered, level pins, data pins, clock pins and latch pins. This information is all stored in a database 4 such as a hard disc.

A store 5 such as a hard disc stores a range of stimuli which can be applied to a model of an integrated circuit. A selector 6 selects an optimum range of stimuli on the basis of the particular type of i.c. under test. This is usually done in dependence of the types of pins used by the i.c. If the integrated circuit the subject of the model is complex, as discussed before up to 9 different types of stimuli may be used in order to obtain sufficiently comprehensive results to guarantee that all the functions of the i.c. are known. The application of each stimulus takes a relatively long period of time. Consequently, selecting the optimum range of stimuli can speed up the process but at the expense of accuracy. It has been found that a reduction of 30 fold can be achieved while still maintaining the accuracy required.

The stimuli selected by the selector 6 are then translated by a first translator 8 from the language of the system into an alien language. The first translator 8 will be specific to the alien environment to be used.

A model of the i.c. under test is stored in an alien store 10. This model has been written by a modeler in an alien language for an alien system. An alien simulator 12 obtains the alien model from the alien store 10 and applies to it the stimuli from the first translator 8. Thus all access to the model is made via the alien simulator to maintain a perfect alien environment.

The results and stimuli are translated by a second translator 14 into the reference language of the system. Again, the second translator 14 is specific to the alien environment. The stimuli and results are then stored in a memory 16 such as a hard disc.

In order to determine all of the functions of the i.c., comprehensive stimuli must be applied and a large number of results are obtained. Even more results are obtained if the alien simulator is an analogue stimulator as discussed previously. Obtaining information directly from the memory would be extremely slow to use. Consequently, the system also includes a condenser means 18 for condensing the stimuli and responses stored.

The condenser means 18 summarises the stimuli and response in a truth table and by associating them in this way, the functions of the i.c. can be determined from the entries in the truth table. If, the stimulus applied to the alien model was comprehensive enough, then the truth table should contain details for each operation of the i.c. model. Consequently, the truth table could be very large; theoretically with entries up to 2n where n is the number of input pins. In order for the truth table to be usable as a reference library to recreate simulation models, it will be necessary to condense the truth table whilst maintaining its integrity. The condenser means thus reduces the number of entries in the truth table using the following process:

a) Don't care optimisation

The condenser means analyses each input pin of each entry to determine whether the pin state actually determines the output state. If the pin could be either 0 or 1 with all other pins the same state and with the same output, then the pin can be set to ?. The two table entries (one where the pin was 1 and the other where it was 0) can be reduced to one table entry.

For example, take the following truth table with inputs a and b and output c.

[ab=c]

00=0

01=0

10=0

11=1 when a=0, b can be either 0 or 1 and the output will still be 0. This is not the case when a=1. When b=0, a can be either 0 or 1 and the output will still be 0. This is not the case when b=1.

The truth table can thus be condensed to

0?=0

?0=0

11=1

The condenser means continues until no further condensing can be achieved.

b) Data pin optimisation

The condenser means then analyses those entries whose output pins have states which are equal to or the inverse of the states of an input pin. The input pins are then set to — and the output pins are set to indicate that their state is equal to the respective input pin.

For example, [en, d1 d2=q1, q2]

100=00

101=00

110=10

111=11

Thus, when en=1, q1=d1 and q2=d2. The truth table can be condensed to

1--=d1 d2

Again the condenser means continues until no further data pin optimisation can be achieved; and c) Otherwise optimisation The condenser means analyses the most frequent output state and all entries having this output state are deleted and replaced by one entry set to otherwise.

For example, [b, a=yb]

00=0

01=0

10=0

11=1

The most frequent output state is 0, so the first three entries are replaced and the truth table is condensed to

11=1 otherwise=0

In this preferred embodiment the condenser means condenses the truth table using the above three phases. These phases must be done in this order otherwise integrity of the truth table will be lost. However, the condenser means may use only the first two phases or the last two phases, or only one of the phases but the optimum reduction will be achieved by all three phases.

For example consider the model of an 8 bit data selector with enable. The truth table for this model will have $2^{12}$, i.e. 4096, entries. The condenser means using this process can reduce the truth table to

[enb,b,a,c,d0,d1,d2,d3,d4,d5,d6,d7=y]

1???????????=0

0111????????-=d7

0101???????-?=d6

0011??????-??=d5

0001????-???=d4

0110???-????=d3

0100??-?????=d2

0010?-??????=d1

0000-???????=d0

Thus when enb=1, the selector is disabled and the output is 0 irrespective of any of the states of the input pins. When enb=0, the selector is enabled and the output is set to the state of input pin d7 when a, b and c pins each=1 and so on.

This process has thus condensed a truth table of 4096 entries to 9. Consequently, the library storing the truth table is less memory intensive with a space spacing of over 400 fold but more importantly the information can be addressed much more quickly.

The condenser means applies the above process raw to the truth table generated from any combinational model. A combinational model is one which operates using combinational logic which results in a truth table whose entries are independent of each other. Models may, however, use sequential logic. That is to say, the outputs of such models depend not only on the present state of the input pins but also on preceding states of the input pins. The sequence in which the input pins change is thus important and the resultant truth table will have entries which are not independent of each other. Thus it is not possible to apply the above process directly without losing the integrity of the truth table.

In order to maintain the truth table's integrity the above process is only applied to a sequential model truth table after all the entries which result in no output changes are deleted and only the last two phases of the process are used.

The condenser means thus first checks the truth table to see whether inverse entries provide the same output as an indication of whether the model is of a combinational or sequential device. That is to say, for example if 01=1 and 10=0 for any entries then the model is of a sequential device and the condenser means removes all the no-output change entries before applying the condensing process. If not, then the model is of a combinational device.

When the condenser means 18 has completed the above process, the condensed truth table is stored in a second memory 20 such as a hard disc. The non-condensed table is written in a third memory 22 which may also be a hard disc so that other condensing processes can be effected if required. The non-condensed table is written when the condenser means 18 first generates the truth table.

A fourth memory 24 contains details of the timing of the i.c. This is obtained from the condenser means which selects those input pin state transitions which cause output pin changes to identify timing stimuli along with the results provide the timing information.

The aforegoing description of the condensing process has been given to reduce the information generated by simulating a model of an i.c. However, the process can be applied in a second embodiment of the present invention.

In this embodiment, an i.c. is tested by a hardware modeler which applies voltages or currents directly.

The hardware modeler takes the place of the alien store 10 and simulator 12 in FIG. 2. The stimulus being applied by the hardware modeler is selected by the selector 6, translated by the first translator 8 and the translated stimuli is received by the hardware modeler and applied to the i.c. The results and stimuli are processed as before.

All the information required to simulate the i.c. is thus stored in the various memories and database: basic information in the data base 4a, stimulus information in the store 5, the truth table in the second memory 20 and the timing information in the fourth memory 24.

When the model is required in another environment another translator (not shown) is required, specific to that environment, to translate the information stored and so recreate the model with all its known operations.

This system is thus more efficient, more accurate, quicker and less memory intensive than known hitherto.

The aforegoing description of the embodiments of the present invention has been given by way of example only and modifications may be made without departing from the scope of the present invention.

What we claim is:

1. A system for determining the operation of an integrated circuit IC, comprising:
   receiving means for receiving and storing information about said integrated circuit and for pre-storing a range of stimuli defined by a reference IC circuit simulator language to be applied to a model of said integrated circuit;
   selecting means for selecting at least one stimulus from said range;
   a first translator for translating said selected stimulus defined by the reference IC circuit simulator language into a translated stimulus defined by an alien IC circuit simulator language;
   an alien simulator for applying said translated stimulus to an alien model of said integrated circuit and obtaining a response to said translated stimulus;
   a second translator for translating said response defined by said alien IC circuit simulator language into a translated response defined by said reference IC circuit simulator language; and
   store means for storing said translated response, said stimulus and said response portraying operation of the integrated circuit.

2. A system as claimed in claim 1, in which said selecting means selects a sub-range from said range of stimuli in dependence upon the said received information.

3. A system as claimed in claim 1, in which said receiving means includes an input translator for translating said information to said reference language.

4. A system as claimed in claim 1, further comprising an alien store for storing said alien model coupled to and accessed by said alien simulator.

5. A system as claimed in claim 1, in which said alien simulator comprises a hardware modeler.

6. A system as claimed in claim 1, further comprising condensing means for condensing the stimulus and response stored in said store means.

7. A system as claimed in claim 6, further comprising a timing store means coupled to the condensing means for storing timing details of the alien model.

8. A system as claimed in claim 6, in which the stimulus and response are stored as a plurality of entries in a truth table each entry being in terms of states associated with related input and output pins of the integrated circuit, the condensing means comprising:
   means for receiving said truth table;
   means for executing the following three steps in order, or for executing only one of the three steps or for executing the first two steps in order or for executing the last two steps in order, to form a condensed truth table, said steps comprising;
   1) comparing two entries identical in all respects apart from the state of one input pin to ascertain whether the state of said input pin determines the output state of the respective entry and if not for deleting one of said entries and for repeating the comparison for all input pins,
   2) identifying two or more entries where the output state is equal to the state of one of the related input pins, the said equal input pin being the corresponding input pin in each identified entry, deleting all but one of the identified entries and amending the remaining one of the identified entries by inserting a number identifing the said equal input pin for the state of the output, and
   3) detecting which output state occurs most often, selecting those entries which have the detected output state, deleting all but one of the selected entries and amending the remaining selected entry by inserting a neutral state for each input pin of that entry; and
   means for outputting the condensed truth table.

9. A system as claimed in claim 8, further comprising a further store for storing said condensed truth table.

10. A system as claimed in claim 8, in which said condensing means further comprises means for determining whether said alien model is a sequential logic model and if so deleting all entries which result in no output changes and subsequently executing steps (2) and (3), as specified in claim 8, alone.

* * * * *